(12) United States Patent
Tan et al.

(10) Patent No.: US 12,190,841 B2
(45) Date of Patent: Jan. 7, 2025

(54) LIQUID CRYSTAL DISPLAY (LCD) PANEL AND PIXEL STRUCTURE SOLVING PROBLEM OF ABNORMAL DISPLAY DUE TO VERTICAL CROSSTALK

(71) Applicant: Shenzhen China Star Optoelectronics Semiconductor Display Technology Co., Ltd., Guangdong (CN)

(72) Inventors: Ruifa Tan, Guangdong (CN); Tianhong Wang, Guangdong (CN); Xiaohui Yao, Guangdong (CN)

(73) Assignee: Shenzhen China Star Optoelectronics Semiconductor Display Technology Co., Ltd., Shenzhen (CN)

( * ) Notice: Subject to any disclaimer, the term of this patent is extended or adjusted under 35 U.S.C. 154(b) by 0 days.

(21) Appl. No.: 17/762,178

(22) PCT Filed: Feb. 24, 2022

(86) PCT No.: PCT/CN2022/077705
§ 371 (c)(1),
(2) Date: Mar. 21, 2022

(87) PCT Pub. No.: WO2023/155227
PCT Pub. Date: Aug. 24, 2023

(65) Prior Publication Data
US 2024/0046899 A1   Feb. 8, 2024

(30) Foreign Application Priority Data

Feb. 17, 2022   (CN) .................. 202210147288.X (51) Int. Cl.
*G09G 3/36* (2006.01)
*G02F 1/13* (2006.01)
(Continued)

(52) U.S. Cl.
CPC ......... *G09G 3/3648* (2013.01); *G02F 1/1309* (2013.01); *G02F 1/134336* (2013.01);
(Continued)

(58) Field of Classification Search
CPC ...... G09G 3/36; G09G 3/3611; G09G 3/3614; G09G 3/3622; G09G 3/3625; G09G 3/364;
(Continued)

(56) References Cited

U.S. PATENT DOCUMENTS

2006/0231838 A1* 10/2006 Kim .................. G02F 1/136213
257/E27.113
2007/0052902 A1   3/2007 Yoo et al.
(Continued)

FOREIGN PATENT DOCUMENTS

CN   101178526   5/2008
CN   102929054   2/2013
(Continued)

OTHER PUBLICATIONS

International Search Report and the Written Opinion Dated Apr. 26, 2022 From the International Searching Authority Re. Application No. PCT/CN2022/077705 and Its Translation Into English. (18 Pages).
(Continued)

*Primary Examiner* — Ke Xiao
*Assistant Examiner* — Nelson Lam (57) ABSTRACT

A pixel structure and a display panel are provided. The pixel structure includes a first pixel electrode, a first longitudinal signal line, and a second longitudinal signal line. The first pixel electrode includes a first main pixel area and a first sub-pixel area. The first longitudinal signal line includes a first main line and a first secondary-line. The second longitudinal signal line includes a second main line and a second
(Continued)

secondary-line. The first main line and the second main line are arranged in the first main pixel area, and the first secondary-line and the second secondary-line are arranged in the first sub-pixel area.

9 Claims, 4 Drawing Sheets

(51) Int. Cl.
  *G02F 1/1343* (2006.01)
  *G02F 1/1362* (2006.01)
  *H01L 27/12* (2006.01)
(52) U.S. Cl.
  CPC ...... *G02F 1/136286* (2013.01); *H01L 27/124* (2013.01); *G09G 2300/0408* (2013.01); *G09G 2300/0426* (2013.01); *G09G 2300/0439* (2013.01); *G09G 2300/0852* (2013.01); *G09G 2320/0209* (2013.01); *G09G 2320/0233* (2013.01)
(58) Field of Classification Search
  CPC .. G09G 3/3644; G09G 3/3648; G09G 3/3659; G09G 3/3666; G09G 3/3674; G09G 3/3677; G09G 3/3681; G09G 3/3685; G09G 3/3688; G09G 3/3692
  USPC .................................................. 345/87–104
  See application file for complete search history.

(56) References Cited

U.S. PATENT DOCUMENTS

| | | | | |
|---|---|---|---|---|
| 2008/0136985 A1* | 6/2008 | Hsieh | ................... | G09G 3/3648 349/39 |
| 2009/0141010 A1* | 6/2009 | Liao | ................... | G09G 3/3648 345/87 |
| 2009/0231505 A1* | 9/2009 | Wang | ................... | G02F 1/13624 349/48 |
| 2010/0156954 A1* | 6/2010 | Kim | ................... | G09G 3/3688 345/690 |
| 2010/0328277 A1 | 12/2010 | Kao et al. | | |
| 2011/0019114 A1* | 1/2011 | Tsubata | ................ | H01L 27/1296 345/212 |
| 2012/0062537 A1* | 3/2012 | Jeong | ................... | G09G 3/3659 345/87 |
| 2012/0104392 A1 | 5/2012 | Son et al. | | |
| 2014/0240309 A1* | 8/2014 | Chien | ................... | G09G 3/3696 345/87 |
| 2015/0116385 A1* | 4/2015 | Lee | ....................... | G09G 3/3607 345/694 |
| 2016/0064413 A1* | 3/2016 | Cai | ....................... | H01L 27/124 257/774 |

FOREIGN PATENT DOCUMENTS

| | | |
|---|---|---|
| CN | 103185996 | 7/2013 |
| CN | 103676355 | 3/2014 |
| CN | 105301855 | 2/2016 |
| CN | 111381408 | 7/2020 |
| CN | 111880328 | 11/2020 |
| CN | 112365831 | 2/2021 |
| CN | 113534544 | 10/2021 |
| CN | 113985669 | 1/2022 |
| JP | 2009-244899 | 10/2009 |

OTHER PUBLICATIONS

Notification of Office Action and Search Report Dated May 17, 2023 From the State Intellectual Property Office of the People's Republic of China Re. Application No. 202210147288.X and Its Translation Into English. (25 Pages).

* cited by examiner

LIQUID CRYSTAL DISPLAY (LCD) PANEL AND PIXEL STRUCTURE SOLVING PROBLEM OF ABNORMAL DISPLAY DUE TO VERTICAL CROSSTALK

RELATED APPLICATIONS

This application is a National Phase of PCT Patent Application No. PCT/CN2022/077705 having International filing date of Feb. 24, 2022, which claims the benefit of priority of China Patent Application No. 202210147288.X filed on Feb. 17, 2022. The contents of the above applications are all incorporated by reference as if fully set forth herein in their entirety.

FIELD AND BACKGROUND OF THE INVENTION

The present application relates to a technical field of displays, and particularly, to a pixel structure and a display panel.

With development of panel products towards narrow borders and high resolution, current ultra-high-definition liquid crystal displays are designed with chip-on-film package methods for gate drivers in such a way that driving signals on scan lines and data lines are configured on a same side, reducing width of left and right sides of liquid crystal displays to achieve effects of ultra-narrow bezels.

Due to parasitic capacitance between data lines and pixel units, changes of data line signals will interfere with stability of pixel unit signals. With ultra-narrow bezel design, pixel units increase in resolution and decrease in size, and coupling of parasitic capacitance between the data lines and the pixel units is more significant to the pixel units, causing vertical crosstalk in panels, thus adversely affecting product quality of the panels. In addition, in the design that gate drivers are packaged with the chip-on-film package methods, since traces of scan lines configured in vertical directions exist in the pixel units, distances between data lines on left and right sides of the pixel units and pixel unit electrodes are different, resulting in differences in parasitic capacitance between the data lines and the pixel unit electrodes. Interference to the pixel units cannot be completely eliminated through general methods by setting signals on the data lines on the left and right sides to be opposite.

Therefore, it is imperative in the art to provide a pixel structure and a display panel to solve a problem of abnormal display caused by vertical crosstalk due to parasitic capacitance to pixel units.

SUMMARY OF THE INVENTION

The present application provides a pixel structure and a display panel capable of solving a problem of abnormal display due to vertical crosstalk caused by parasitic capacitance to pixel units.

In one aspect, an embodiment of the present application provides a pixel structure, including a first pixel electrode, a second pixel electrode, a transverse signal line, a first longitudinal signal line, and a second longitudinal signal line. The first pixel electrode includes a first main pixel area and a first sub-pixel area. The second pixel electrode is arranged in alternation with the first pixel electrode in a first direction and includes a second main pixel area and a second sub-pixel area. The transverse signal line is located between the first main pixel area and the first sub-pixel area and extending in the first direction. The first longitudinal signal line includes a first main line and a first secondary-line, and a second longitudinal signal line includes a second main line and a second secondary-line. Each of the first main line and the second main line is arranged in the first main pixel area, each of the first secondary-line and the second secondary-line are arranged in the first sub-pixel area, and electrical signals on the first longitudinal signal line and the second longitudinal signal line are opposite.

Optionally, each of the first longitudinal signal line and the second longitudinal signal line is located within an area between an edge region and a center region of the first pixel electrode.

Optionally, the first longitudinal signal line and the second longitudinal signal line are symmetrical with respect to a center line of the first pixel electrode.

Optionally, the first longitudinal signal line is electrically connected to one of the first pixel electrode or the second pixel electrode, and the second longitudinal signal line is electrically connected to the other of the first pixel electrode or the second pixel electrode.

Optionally, in some embodiments of the present application, the first pixel electrode and the second pixel electrode are alternately arranged in a second direction, wherein the first longitudinal signal line further includes a first sub-line, one end of the first sub-line is electrically connected to the first main line, and the other end is electrically connected to the first secondary-line; the second longitudinal signal line further includes a second sub-line, one end of the second sub-line is electrically connected to the second main line, and the other end of the second sub-line is electrically connected to the second secondary line.

Optionally, in some embodiments of the present application, the pixel structure further includes a first shared electrode arranged along and overlapping a center line of the first pixel electrode.

Optionally, in some embodiments of the present application, the pixel structure further includes a second shared electrode arranged along and overlapping a center line of the second pixel electrode.

Optionally, in some embodiments of the present application, the first shared electrode and the second shared electrode receive different voltage signals, respectively.

Optionally, in some embodiments of the present application, the transverse signal line is a scan signal line, and the first longitudinal signal line and the second longitudinal signal line both are data signal lines.

Optionally, in some embodiments of the present application, the pixel structure further includes a short circuit detection module. The data signal lines are located in a metal layer electrically connected to pins included in the short circuit detection module.

In another aspect, the present application provides a display panel, including a base substrate and a pixel structure disposed on the base substrate. The pixel structure includes a first pixel electrode includes a first main pixel area and a first sub-pixel area; a second pixel electrode arranged in alternation with the first pixel electrode in a first direction and comprising a second main pixel area and a second sub-pixel area; a transverse signal line located between the first main pixel area and the first sub-pixel area and extending in the first direction; a first longitudinal signal line comprising a first main line and a first secondary-line; a second longitudinal signal line comprising a second main line and a second secondary-line. Each of the first main line and the second main line is arranged in the first main pixel area, each of the first secondary-line and the second secondary-line are arranged in the first sub-pixel area, and electrical signals on the first longitudinal signal line and the second longitudinal signal line are opposite.

Optionally, each of the first longitudinal signal line and the second longitudinal signal line is located within an area between an edge region and a center region of the first pixel electrode.

Optionally, the first longitudinal signal line and the second longitudinal signal line are symmetrical with respect to a center line of the first pixel electrode.

Optionally, the first longitudinal signal line is electrically connected to one of the first pixel electrode or the second pixel electrode, and the second longitudinal signal line is electrically connected to the other of the first pixel electrode or the second pixel electrode.

Optionally, in some embodiments of the present application, the first pixel electrode and the second pixel electrode are alternately arranged in a second direction, wherein the first longitudinal signal line further includes a first sub-line, one end of the first sub-line is electrically connected to the first main line, and the other end is electrically connected to the first secondary-line; the second longitudinal signal line further includes a second sub-line, one end of the second sub-line is electrically connected to the second main line, and the other end of the second sub-line is electrically connected to the second secondary line.

Optionally, in some embodiments of the present application, the pixel structure further includes a first shared electrode arranged along and overlapping a center line of the first pixel electrode.

Optionally, in some embodiments of the present application, the pixel structure further includes a second shared electrode arranged along and overlapping a center line of the second pixel electrode.

Optionally, in some embodiments of the present application, the first shared electrode and the second shared electrode receive different voltage signals, respectively.

Optionally, in some embodiments of the present application, the transverse signal line is a scan signal line, and the first longitudinal signal line and the second longitudinal signal line both are data signal lines.

Optionally, in some embodiments of the present application, the pixel structure further includes a short circuit detection module. The data signal lines are located in a metal layer electrically connected to pins included in the short circuit detection module.

The present application has advantageous effects as follows: the present application provides the pixel structure, including the first pixel electrode, the second pixel electrode, the transverse signal line, the first longitudinal signal line, and the second longitudinal signal line. The first pixel electrode includes the first main pixel area and the first sub-pixel area. The second pixel electrode is arranged in alternation with the first pixel electrode in the first direction and includes the second main pixel area and the second sub-pixel area. The transverse signal line is located between the first main pixel area and the first sub-pixel area and extending in the first direction. The first longitudinal signal line includes the first main line and the first secondary-line, and the second longitudinal signal line includes the second main line and the second secondary-line. Each of the first main line and the second main line is arranged in the first main pixel area, each of the first secondary-line and the second secondary-line is arranged in the first sub-pixel area, and electrical signals on the first longitudinal signal line and the second longitudinal signal line are opposite. In the pixel structure of the present application, two data lines connected to the adjacent first pixel electrode and the second pixel electrode, respectively, are arranged in the pixel area of the first pixel electrode in order to cancel the capacitive coupling between the first longitudinal signal line and the second longitudinal signal line and the first pixel electrode, which is beneficial to eliminate vertical crosstalk and improve display performance.

BRIEF DESCRIPTION OF THE SEVERAL VIEWS OF THE DRAWINGS

In order to better illustrate the technical solutions in the embodiments of the present application, the following will briefly introduce the accompanying drawings that need to be used in the description of the embodiments. Apparently, the accompanying drawings in the following description show merely some embodiments of the present invention, and a person skilled in the art may still derive other drawings from these accompanying drawings without creative efforts.

DESCRIPTION OF SPECIFIC EMBODIMENTS OF THE INVENTION

The technical solutions in the embodiments of the present application will be clearly and completely described below in conjunction with the drawings in the embodiments of the present application. Obviously, the described embodiments are only a part of the embodiments of the present application, rather than all the embodiments. Based on the embodiments in this application, all other embodiments obtained by those skilled in the art without creative work shall fall within the protection scope of this application.

Embodiments of the present application provide a pixel structure and a display panel capable of solving a problem of abnormal display due to vertical crosstalk caused by parasitic capacitance to pixel units. Detailed descriptions are given below. It should be noted that the description order of the following embodiments is not intended to limit the preferred order of the embodiments. In addition, in the description of this application, the term "including" means "including but not limited to". The terms "first", "second", "third", etc. are used to distinguish different objects, rather than to describe a specific sequence.

Figure 1:
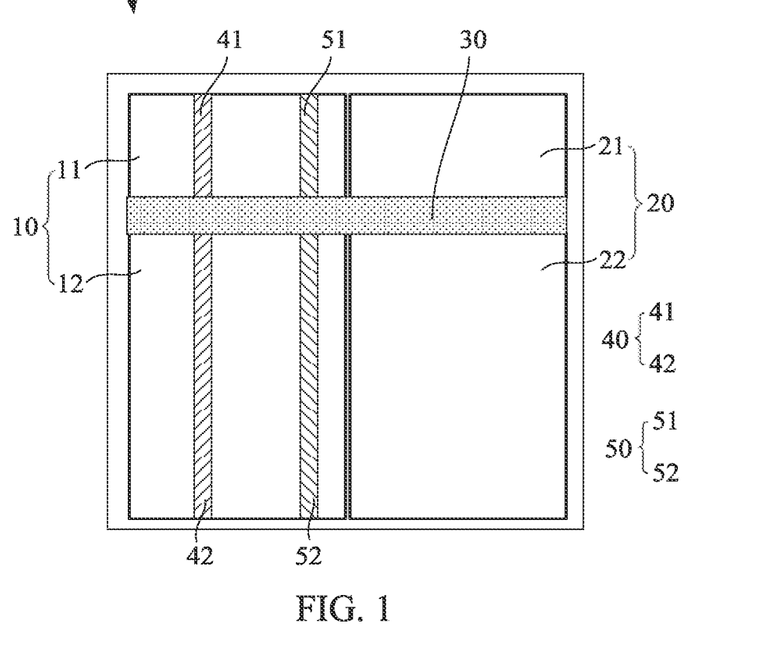
FIG. 1 is a first top plan view of a pixel structure provided by an embodiment of the present application.
Figure 2:
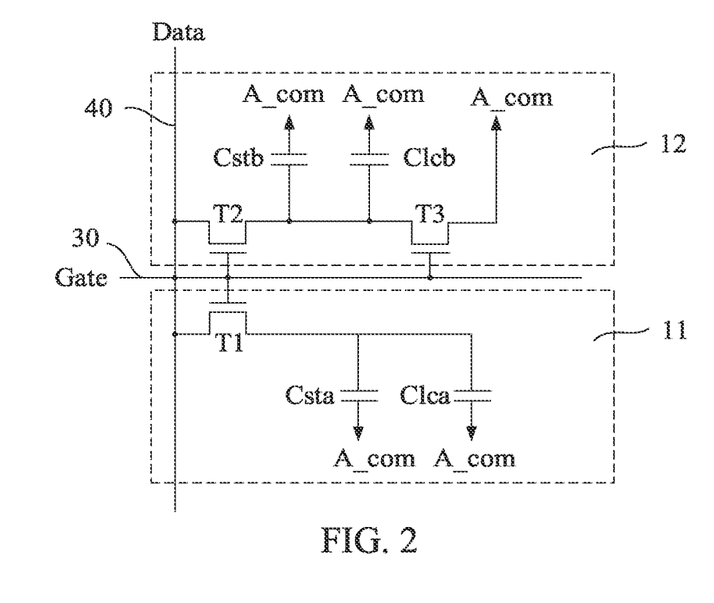
FIG. 2 is a circuit diagram of a pixel structure provided by an embodiment of the present application.
Figure 3:
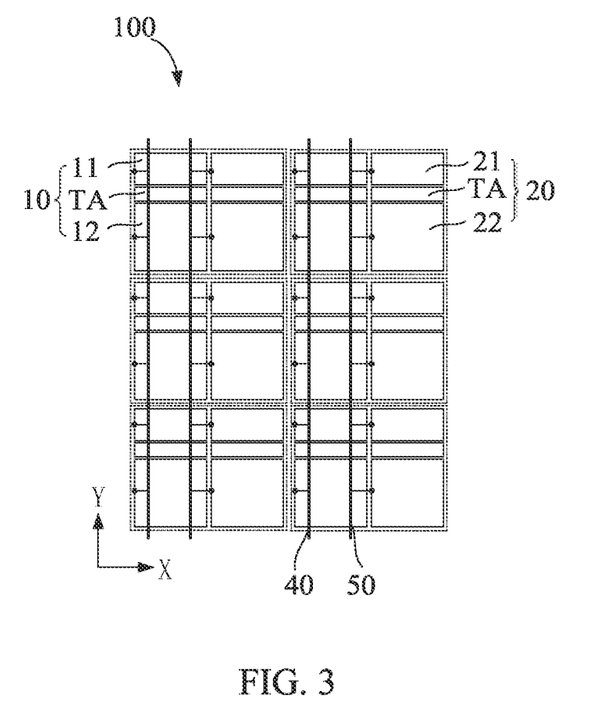
FIG. 3 is a first layout view of a pixel structure provided by an embodiment of the present application.
Figure 4:
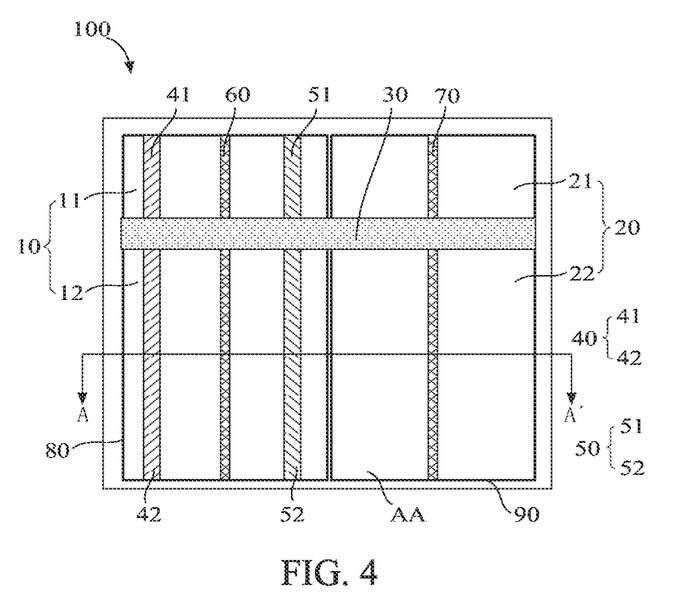
FIG. 4 is a second top plan view of a pixel structure provided by an embodiment of the present application.

Please refer to FIGS. 1 to 4. FIG. 1 is a first top plan view of a pixel structure provided by an embodiment of the present application; FIG. 2 is a circuit diagram of a pixel structure provided by an embodiment of the present application; FIG. 3 is a first layout view of a pixel structure provided by an embodiment of the present application; FIG. 4 is a second top plan view of a pixel structure provided by an embodiment of the present application. As shown in FIG. 1, an embodiment of the present application provides a pixel structure 100, including a first pixel electrode 10, a second pixel electrode 20, a transverse signal line 30, a first longitudinal signal line 40, and a second longitudinal signal line 50. The first pixel electrode 10 includes a first main pixel area 11 and a first sub-pixel area 12. The second pixel electrode 20 is arranged in alternation with the first pixel electrode 10 in a first direction X and includes a second main pixel area 21 and a second sub-pixel area 22. The transverse signal line 30 is located between the first main pixel area 11 and the first sub-pixel area 12 and extends in the first direction X. The first longitudinal signal line 40 includes a first main line 41 and a first secondary-line 42. The second longitudinal signal line 50 includes a second main line 51 and a second secondary-line 52. Specifically, each of the first main line 41 and the second main line 51 is arranged in the first main pixel area 11, each of the first secondary-line 42 and the second secondary-line 52 is arranged in the first sub-pixel area 12, and electrical signals on the first longitudinal signal line 40, and the second longitudinal signal line 50 are opposite.

In the pixel structure provided by the present application, the first main line 41 and the second main line 51 are both disposed in the first main pixel area 11, both the first secondary-line 42 and the second secondary-line 52 are disposed in the first sub-pixel area 12, and the electrical signals on the first vertical signal line 40 and the second vertical signal line 50 are opposite to each other. Such a structure can cancel effects of capacitive coupling between the first longitudinal signal line 40, and the second longitudinal signal line 50 and the first pixel electrode 10, which is beneficial to eliminate vertical crosstalk and improve display performance. Compared with adjacent ones of conventional data lines located in corresponding pixel areas, a distance between the first longitudinal signal line 40 and the adjacent second longitudinal signal line 50 in the present application is relative closer, and an effect of canceling the coupling is more significant.

In the embodiment of the present application, the transverse signal line 30 is a scanning signal line, and the first longitudinal signal line 40 and the second longitudinal signal line 50 are both data signal lines.

In the embodiment of the present application, the transverse signal line 30 is located in a transistor circuit area TA, that is, the transistor circuit area TA is located between the first main pixel area 11 and the first sub-pixel area 12, and is also located between the second main pixel area 21 and the second sub-pixel area 22. As shown in FIG. 2, each transistor circuit area TA corresponding to the first pixel electrode 10 or the second pixel electrode 20 is provided with a first transistor T1, a second transistor T2, and a third transistor T3. FIG. 2 is a pixel structure based on a transverse signal line 30, a data line and three thin-film transistors in an embodiment of the present application. Taking the first pixel electrode 10 as an example: the first main pixel area 11 includes a first transistor T1, a first liquid crystal capacitor Clca, and a first storage capacitor Csta. A gate of the first transistor T1 is electrically connected to the transverse signal line 30, and a source and a drain of the first transistor T1 are electrically connected to the first main line 41 of the first longitudinal signal line 40 and the first liquid crystal capacitor Clca, respectively. The first liquid crystal capacitor Clca and the first storage capacitor Csta are connected in parallel between the drain/source of the first transistor T1 and a common electrode A_com.

Specifically, the first sub-pixel area 12 includes a second transistor T2, a third transistor T3, a second liquid crystal capacitor Clcb, and a second storage capacitor Cstb. A gate of the second transistor T2 is electrically connected to the transverse signal line 30, and a source and a drain of the second transistor T2 are electrically connected to the first secondary-line 42 of the first longitudinal signal line 40 and the second liquid crystal capacitor Clcb, respectively. A gate of the third transistor T3 is electrically connected to the transverse signal line 30, and a source and a drain of the third transistor T3 are electrically connected to the drain/source and a common electrode A_com of the second transistor T2, respectively. Correspondingly, the thin-film transistor in the second pixel electrode 20 is electrically connected to the second longitudinal signal line 50.

In the embodiment of the present application, the transverse signal line 30 is a scan line for providing scan signals; the first longitudinal signal line 40 is a first data line for providing data signals; the second longitudinal signal line 50 is a second data line for providing data signals.

In the embodiment of the present application, the first longitudinal signal line 40 and the second longitudinal signal line 50 are parallel to each other, and the transverse signal line 30 is perpendicular to the first longitudinal signal line 40 and the second longitudinal signal line 50. Such a structure is beneficial to wiring layouts in the pixel structure.

In an embodiment of the present application, further, the first longitudinal signal line 40 and the second longitudinal signal line 50 are symmetrical with respect to a center line of the first pixel electrode 10. That is, a distance between the first longitudinal signal line 40 and the center line of the first pixel electrode 10 is equal to a distance between the second longitudinal signal line 50 and the center line of the first pixel electrode 10. In this manner, it is beneficial to cancel the coupling of signal inversion between the first longitudinal signal line 40 and the second longitudinal signal line 50 on the first pixel electrode 10, and both the first longitudinal signal line 40 and the second longitudinal signal line 50 are located in the main pixel area or the sub-pixel area of the first pixel electrode 10. Therefore, a distance between the first longitudinal signal line 40 and the second longitudinal signal line 50 is shorter, which is beneficial to minimize the crosstalk of an image. In addition, it is beneficial to increase an area of an opening area AA of the first pixel electrode 10 or the second pixel electrode 20 by using space between the first pixel electrode 10 and the second pixel electrode 20 originally configured for placing data lines, thus improving an aperture ratio and increasing transmittance.

In the embodiment of the present application, the first longitudinal signal line 40 is electrically connected to one of the first pixel electrode 10 or the second pixel electrode 20. The second longitudinal signal line 50 is electrically connected to the other of the first pixel electrode 10 or the second pixel electrode 20. As shown in FIG. 3, the first longitudinal signal line 40 is electrically connected to the first pixel electrode 10; the second longitudinal signal line 50 is electrically connected to the second pixel electrode 20. Specifically, the first main line 41 is electrically connected to the first transistor T1; the first secondary-line 42 is electrically connected to the second transistor T2. The first pixel electrodes 10 and the second pixel electrodes 20 are alternately arranged in the first direction X. Specifically, the first longitudinal signal line 40 and the second longitudinal signal line 50 may also be located in the second pixel electrode 20 (not shown). Those skilled in the art can modify the arrangement as needed, which is not limited in this application.

In one embodiment of the present application, as shown in FIG. 4, the pixel structure further includes a first shared electrode 60 arranged along and overlapping the center line of the first pixel electrode 10. The first shared electrode 60 is configured to adjust a voltage difference between the first main pixel area 11 and the first sub-pixel area 12 to adjust overall brightness of the first pixel electrode 10. Specifically, the first longitudinal signal line 40 and the second longitudinal signal line 50 are symmetrical with respect to the first shared electrode 60. In this fashion, a distance between the first longitudinal signal line 40 and the first shared electrode 60 is equal to a distance between the second longitudinal signal line 50 and the first shared electrode 60, which is beneficial to the wiring layout and can further enhance the effect of canceling the coupling. Specifically, a material of the first shared electrode 60 includes a metal oxide, such as at least one of indium tin oxide, indium zinc oxide, aluminum tin oxide, aluminum zinc oxide, indium germanium zinc oxide, etc., or a metal combination thereof.

In one embodiment of the present application, the pixel structure further includes a second shared electrode 70 arranged along and overlapping a center line of the second pixel electrode 20. The second shared electrode 70 is configured to adjust a voltage difference between the second main pixel area 21 and the second sub-pixel area 22 to adjust overall brightness of the second pixel electrode 20. In this fashion, the distance between the first longitudinal signal line 40 and the first shared electrode 60 is equal to the distance between the second longitudinal signal line 50 and the first shared electrode 60, which is beneficial to the wiring layout and can further enhance the effect of canceling the coupling. Specifically, a material of the second shared electrode 70 includes a metal oxide, such as at least one of indium tin oxide, indium zinc oxide, aluminum tin oxide, aluminum zinc oxide, indium germanium zinc oxide, etc., or a metal combination thereof.

In one embodiment of this application, the first shared electrode 60 and the second shared electrode 70 receive different voltage signals, respectively. Specifically, the first pixel electrode 10 and the second pixel electrode 20 can be regarded as a cycle pixel unit, and are arranged in an array on the display panel 300, but may bring about a defect that resolution of the display panel 300 is reduced. Therefore, in this embodiment, the first shared electrode 60 and the second shared electrode 70 are disposed, respectively, and voltage signals of the first shared electrode 60 and the second shared electrode 70 can be adjusted independently in order to enable individual adjustment of display brightness of the first pixel electrode 10 and the second pixel electrode 20, so that the above-mentioned defect is overcome. Furthermore, since the first longitudinal signal line 40 and the second longitudinal signal line 50 are disposed in the opening area AA of the first pixel electrode 10 or the second pixel electrode 20, a problem of shading is prone to occur, causing the brightness of the first pixel electrode 10 and the second pixel electrode 20 to be inconsistent. By connecting the first shared electrode 60 and the second shared electrode 70 with different voltage signals, respectively, the display brightness of the first pixel electrode 10 and the second pixel electrode 20 is adjusted, which is beneficial to prevent color shift and achieve brightness uniformity.

In one embodiment of the present application, each of the first longitudinal signal line 40 and the second longitudinal signal line 50 is located within an area between an edge region and a center region of the first pixel electrode 10, that is, in the opening area AA. Specifically, the first pixel electrode 10 includes a first common electrode 80, and a square area surrounded by the first common electrode 80 is the opening area AA of the first pixel electrode 10; correspondingly, the second pixel electrode 20 includes a second common electrode 90, and a square area surrounded by the second common electrode 90 is the opening area AA of the second pixel electrode 20. That is, the first common electrode 80 and the second common electrode 90 are disposed in a non-display area of each of the first pixel electrode 10 and the second pixel electrode 20. Further, the first longitudinal signal line 40 and the second longitudinal signal line 50 are parallel in a width direction of the opening area AA of the first pixel electrode 10. A distance between the first common electrode 80 located in a length direction of one side of the first pixel electrode 10 and the first longitudinal signal line 40, and a distance between the first common electrode 80 located in the length direction of an opposite side of the first pixel electrode 10 and the second longitudinal signal line 50 are both greater than a predetermined distance. Specifically, the predetermined distance needs to satisfy: an electric field formed by a voltage difference between the first longitudinal signal line 40 and the second longitudinal signal line 50 and the first common electrode 80 located in the length direction of the opposite two sides of the first pixel electrode 10 cannot make liquid crystal molecules deflect significantly.

The pixel structure provided by this application includes: the first pixel electrode 10, the second pixel electrode 20, the transverse signal line 30, the first longitudinal signal line 40, and the second longitudinal signal line 50. The first pixel electrode 10 includes the first main pixel area 11 and the first sub-pixel area 12. The second pixel electrode 20 is arranged in alternation with the first pixel electrode 10 in the first direction X and includes the second main pixel area 21 and the second sub-pixel area 22. The transverse signal line 30 is located between the first main pixel area 11 and the first sub-pixel area 12 and between the second main pixel area 21 and the second sub-pixel area 22. The first longitudinal signal line 40 includes the first main line 41 and the first secondary-line 42. The second longitudinal signal line 50 includes the second main line 51 and the second secondary-line 52. Specifically, electrical signals on the first longitudinal signal line 40 and the second longitudinal signal line 50 are opposite. The first main line 41 and the second main line 51 are both disposed in the first main pixel area 11, and the first secondary-line 42 and the second secondary-line 52 are both disposed in the first sub-pixel area 12. In the pixel structure of the present application, the two data lines connected to the adjacent first pixel electrode 10 and the second pixel electrode 20, respectively, are arranged in the pixel area of the first pixel electrode 10 in order to cancel the capacitive coupling between the first longitudinal signal line 40 and the second longitudinal signal line 50 and the first pixel electrode 10, which is beneficial to eliminate vertical crosstalk and improve display performance.

Figure 5:
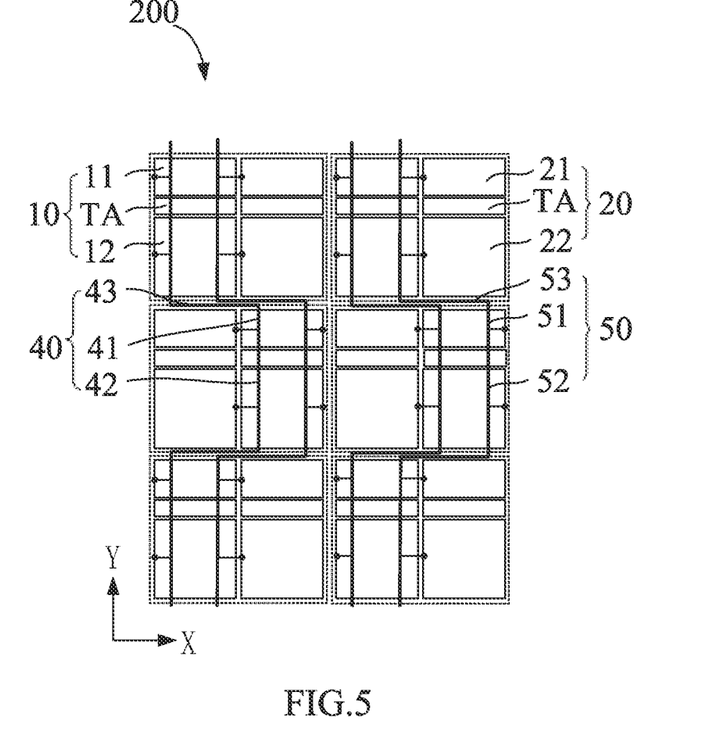
FIG. 5 is a second layout view of a pixel structure provided by an embodiment of the present application.

As a specific embodiment of the present application, please refer to FIG. 5 and FIG. 4. FIG. 5 is a second layout view of the pixel structure provided by an embodiment of the present application. This embodiment is an improvement for the above-mentioned embodiment. As shown in FIG. 5, the embodiment of the present application provides a pixel structure 200, wherein differences between the pixel structure 200 and the pixel structure 100 are as follows: the first pixel electrode 10 and the second pixel electrode 20 are alternately arranged in a second direction Y, the first longitudinal signal line 40 further includes a first sub-line 43, one end of the first sub-line 43 is electrically connected to the first main line 41, and the other end of the first sub-line 43 is electrically connected to the first secondary-line 42; the second longitudinal signal line 50 further includes a second sub-line 53, one end of the second sub-line 53 is electrically connected to the second main line 51, and the other end of the second sub-line 53 is electrically connected to the second secondary-line 52.

Specifically, the pixel structure 200 further includes a first pixel electrode 10, a second pixel electrode 20, a transverse signal line 30, a first longitudinal signal line 40, and a second longitudinal signal line 50. The first pixel electrode 10 includes a first main pixel area 11 and a first sub-pixel area 12. The second pixel electrode 20 is arranged in alternation with the first pixel electrode 10 in a first direction X and includes a second main pixel area 21 and a second sub-pixel area 22. The transverse signal line 30 is located between the first main pixel area 11 and the first sub-pixel area 12 and extends in the first direction X. The first longitudinal signal line 40 includes a first main line 41 and a first secondary-line 42. The second longitudinal signal line 50 includes a second main line 51 and a second secondary-line 52. Specifically, each of the first main line 41 and the second main line 51 is arranged in the first main pixel area 11, each of the first secondary-line 42 and the second secondary-line 52 is arranged in the first sub-pixel area 12, and electrical signals on the first longitudinal signal line 40 and the second longitudinal signal line 50 are opposite.

In one embodiment of the present application, the transverse signal line 30 is located in a transistor circuit area TA, that is, the transistor circuit area TA is located between the first main pixel area 11 and the first sub-pixel area 12, and is also located between the second main pixel area 21 and the second sub-pixel area 22.

In one embodiment of the present application, the first longitudinal signal line 40 and the second longitudinal signal line 50 are parallel to each other, and the transverse signal line 30 is perpendicular to the first longitudinal signal line 40 and the second longitudinal signal line 50. Further, the first longitudinal signal line 40 and the second longitudinal signal line 50 are symmetrical with respect to a center line of the first pixel electrode 10. That is, a distance between the first longitudinal signal line 40 and the center line of the first pixel electrode 10 is equal to a distance between the second longitudinal signal line 50 and the center line of the first pixel electrode 10. In this manner, it is beneficial to cancel the coupling of signal inversion between the first longitudinal signal line 40 and the second longitudinal signal line 50 on the first pixel electrode 10, and both the first longitudinal signal line 40 and the second longitudinal signal line 50 are located in the main pixel area or the sub-pixel area of the first pixel electrode 10. Therefore, a distance between the first longitudinal signal line 40 and the second longitudinal signal line 50 is shorter, which is beneficial to minimize the crosstalk of an image. In addition, it is beneficial to increase an area of an opening area AA of the first pixel electrode 10 or the second pixel electrode 20 by using space between the first pixel electrode 10 and the second pixel electrode 20 originally configured for placing data lines, thus improving an aperture ratio and increasing transmittance.

In one embodiment of the present application, the first longitudinal signal line 40 is electrically connected to one of the first pixel electrode 10 or the second pixel electrode 20. The second longitudinal signal line 50 is electrically connected to the other of the first pixel electrode 10 or the second pixel electrode 20. As shown in FIG. 3, the first longitudinal signal lines 40 are electrically connected to the first pixel electrodes 10 in odd numbered rows, and the first longitudinal signal lines 40 are electrically connected to the second pixel electrodes 20 in even numbered rows; correspondingly, the second longitudinal signal lines 50 are electrically connected to the second pixel electrodes 20 in odd numbered rows, and the second longitudinal signal lines 50 are electrically connected to the first pixel electrodes 10 in even numbered rows. Specifically, the first pixel electrode 10 and the second pixel electrode 20 may be partially alternately arranged in the first direction X and the second direction Y, and may be partially alternately arranged in the first direction X (not shown). Those skilled in the art can modify the arrangement as needed, which is not limited in this application.

In one embodiment of the present application, please continue to refer to FIG. 4. The pixel structure further includes the first shared electrode 60 and the second shared electrode 70. The first shared electrode 60 is arranged along and overlapping the center line of the first pixel electrode 10, and the second shared electrode 70 is arranged along and overlapping the center line of the second pixel electrode 20. Specifically, the first longitudinal signal line 40 and the second longitudinal signal line 50 are symmetrical with respect to the first shared electrode 60. In this fashion, the distance between the first longitudinal signal line 40 and the first shared electrode 60 is equal to the distance between the second longitudinal signal line 50 and the first shared electrode 60, which is beneficial to the wiring layout and can further enhance the effect of canceling the coupling.

In one embodiment of this application, the first shared electrode 60 and the second shared electrode 70 receive different voltage signals, respectively. Furthermore, since the first longitudinal signal line 40 and the second longitudinal signal line 50 are disposed in the opening area AA of the first pixel electrode 10 or the second pixel electrode 20, a problem of shading tends to occur, causing the brightness of the first pixel electrode 10 and the second pixel electrode 20 to be inconsistent. By connecting the first shared electrode 60 and the second shared electrode 70 with different voltage signals, respectively, the display brightness of the first pixel electrode 10 and the second pixel electrode 20 is adjusted, which is beneficial to prevent color shift and achieve brightness uniformity.

In one embodiment of the present application, the pixel structure further includes a short circuit detection module (not shown). Specifically, the data signal lines, that is, the first longitudinal line and the second longitudinal line, are located in a metal layer electrically connected to pins of the short circuit detection module.

In the pixel structure of the present application, the two data lines connected to the adjacent first pixel electrode 10 and the second pixel electrode 20, respectively, are arranged in the pixel area of the first pixel electrode 10 in order to cancel the capacitive coupling between the first longitudinal signal line 40 and the second longitudinal signal line 50 and the first pixel electrode 10, which is beneficial to eliminate vertical crosstalk and improve display performance.

Figure 6:
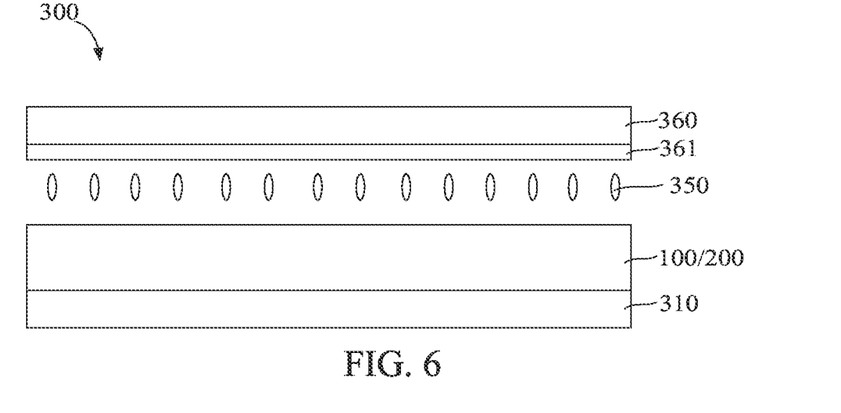
FIG. 6 is a schematic structural view of a display panel provided by an embodiment of the present application.
Figure 7:
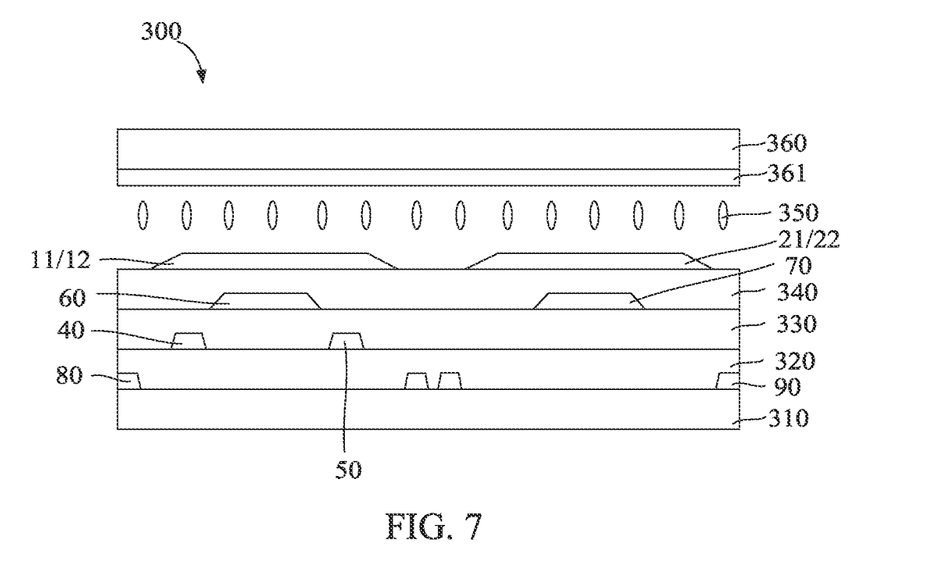
FIG. 7 is a partial cross-sectional view taken along line A-A' of FIG. 1.

Please refer to FIGS. 6 and 7. FIG. 6 is a schematic structural view of a display panel 300 provided by an embodiment of the present application. FIG. 7 is a partial cross-sectional view taken along line A-A' of FIG. 1. As shown in FIG. 6, the present application provides the display panel 300 including a base substrate 310 and the above-mentioned pixel structure. The pixel structure is disposed on the base substrate 310.

In the embodiment of the present application, as shown in FIG. 6, the display panel 300 further includes a color filter substrate 360 disposed on a side of the pixel structure away from the base substrate 310, and the pixel structure and a display medium 350 located between the base substrate 310 and the color filter substrate 360.

In one embodiment of the present application, a material of the base substrate may be glass, quartz, organic polymer, or opaque/reflective material (e.g., conductive material, wafer, ceramic, or other applicable materials), or may be other applicable materials.

In one embodiment of the present application, the display medium 350 may include liquid crystal molecules, an electrophoretic display medium, or other applicable media. The display medium 350 in the following embodiments of the present invention takes liquid crystal molecules as an example, but is not limited thereto. In addition, the liquid crystal molecules in the embodiments of the present application are preferably, but not limited to, liquid crystal molecules that can be rotated or switched by a horizontal electric field or liquid crystal molecules that can be rotated or switched by a transverse electric field.

Specifically, as shown in FIG. 7, the display panel 300 includes the base substrate 310, and a first common electrode 80, a second common electrode 90, a first insulating layer 320, a first longitudinal signal line 40, a second longitudinal signal line 50, a second insulating layer 330, a first shared electrode 60, a second shared electrode 70, a third insulating layer 340, a first main pixel area 11/first sub-pixel area 12, a second main pixel area 21/second sub-pixel area 22 all sequentially disposed on the base substrate 310, and the color filter substrate 360 and a common electrode layer 361 disposed on the color filter substrate 360. Specifically, a material of the first insulating layer 320/the second insulating layer 330/the third insulating layer 340 may be inorganic materials (for example: silicon oxide, silicon nitride, silicon oxynitride, or a stack layer of at least two of the above materials), organic materials, or a combination of the above.

The present application provides the pixel structure and the display panel 300. The pixel structure includes the first pixel electrode 10, the second pixel electrode 20, the transverse signal line 30, the first longitudinal signal line 40, and the second longitudinal signal line 50. The first pixel electrode 10 includes the first main pixel area 11 and the first sub-pixel area 12. The second pixel electrode 20 is arranged in alternation with the first pixel electrode 10 in the first direction X and includes the second main pixel area 21 and the second sub-pixel area 22. The transverse signal line 30 is located between the first main pixel area 11 and the first sub-pixel area 12 and between the second main pixel area 21 and the second sub-pixel area 22. The first longitudinal signal line 40 includes the first main line 41 and the first secondary-line 42. The second longitudinal signal line 50 includes the second main line 51 and the second secondary-line 52. Specifically, electrical signals on the first longitudinal signal line 40 and the second longitudinal signal line 50 are opposite. The first main line 41 and the second main line 51 are both disposed in the first main pixel area 11, and the first secondary-line 42 and the second secondary-line 52 are both disposed in the first sub-pixel area 12. In the pixel structure of the present application, the two data lines connected to the adjacent first pixel electrode 10 and the second pixel electrode 20, respectively, are arranged in the pixel area of the first pixel electrode 10 in order to cancel the capacitive coupling between the first longitudinal signal line 40 and the second longitudinal signal line 50 and the first pixel electrode 10, which is beneficial to eliminate vertical crosstalk and improve display performance.

The display panel may be any product or component with the display function, such as electronic paper, mobile phones, tablet computers, televisions, monitors, notebook computers, digital photo frames, navigators, etc.

The above describes in detail the pixel structure and the display panel provided by the embodiments of the present application. Specific examples are used in this article to illustrate the principles and implementation of the application, and the descriptions of the above examples are only used to help understand the methods and core ideas of the application; In addition, for those skilled in the art, according to the idea of the application, there will be changes in the specific implementation and the scope of application. In summary, the content of this specification should not be construed as a limitation of the application.

What is claimed is:

1. A display panel comprising:
   a base substrate; and
   a pixel structure disposed on the base substrate, wherein the pixel structure comprises:
      a first pixel electrode comprising a first main pixel area and a first sub-pixel area, wherein the first main pixel area and the first sub-pixel area are arranged in a second direction perpendicular to the first direction;
      a second pixel electrode arranged in alternation with the first pixel electrode in a first direction and comprising a second main pixel area and a second sub-pixel area, wherein the second main pixel area and the second sub-pixel area are arranged in the second direction;
      a transverse signal line located between the first main pixel area and the first sub-pixel area and extending in the first direction, wherein the transverse signal line is a scan signal line;
      a first longitudinal signal line comprising a first main line and a first secondary-line extending along the second direction, wherein the first longitudinal signal line is a data signal line; and
      a second longitudinal signal line comprising a second main line and a second secondary-line extending along the second direction, wherein the second longitudinal signal line is a data signal line;
      wherein each of the first main line and the second main line is arranged in the first main pixel area, each of the first secondary-line and the second secondary-line is arranged in the first sub-pixel area, and electrical signals on the first longitudinal signal line and the second longitudinal signal line are opposite; and
   wherein the display panel further comprises:
      a first common electrode disposed on the base substrate;
      a second common electrode disposed on the base substrate and in a same layer as the first common electrode;
      a first insulating layer disposed on the base substrate and covering the first common electrode and the second common electrode; wherein the first longitudinal signal line and the second longitudinal signal line are disposed on the first insulating layer and in a same layer;
      a second insulating layer disposed on the first insulating layer and covering the first longitudinal signal line and the second longitudinal signal line;
      a first shared electrode disposed on the second insulating layer, wherein the first shared electrode is disposed between the first longitudinal signal line and the second longitudinal signal line in a direction parallel to the base substrate;
      a second shared electrode disposed on the second insulating layer; and
      a third insulating layer disposed on the second insulating layer and covering the first shared electrode and the second shared electrode;

wherein the first pixel electrode and the second pixel electrode are disposed on the third insulating layer, the first pixel electrode covers the first shared electrode, and the second pixel electrode covers the second shared electrode.

2. The display panel of claim 1, wherein each of the first longitudinal signal line and the second longitudinal signal line is located within an area between an edge region and a center region of the first pixel electrode.

3. The display panel of claim 2, wherein the first longitudinal signal line and the second longitudinal signal line are symmetrical with respect to a center line of the first pixel electrode.

4. The display panel of claim 3, wherein the first longitudinal signal line is electrically connected to one of the first pixel electrode or the second pixel electrode, and the second longitudinal signal line is electrically connected to another of the first pixel electrode or the second pixel electrode.

5. The display panel of claim 4, wherein the first pixel electrode and the second pixel electrode are alternately arranged in a second direction, wherein the first longitudinal signal line further comprises a first sub-line, one end of the first sub-line is electrically connected to the first main line, and another end is electrically connected to the first secondary-line;

wherein the second longitudinal signal line further comprises a second sub-line, one end of the second sub-line is electrically connected to the second main line, and another end of the second sub-line is electrically connected to the second secondary-line.

6. The display panel of claim 1, further comprising a first shared electrode arranged along and overlapping a center line of the first pixel electrode.

7. The display panel of claim 6, further comprising a second shared electrode arranged along and overlapping a center line of the second pixel electrode.

8. The display panel of claim 7, wherein the first shared electrode and the second shared electrode receive different voltage signals, respectively.

9. The display panel of claim 1, wherein the first main pixel area comprises a first transistor, a first liquid crystal capacitor, and a first storage capacitor; wherein a gate of the first transistor is electrically connected to the transverse signal line, a source of the first transistor is electrically connected to the first main line, and a drain of the first transistor is electrically connected to the first liquid crystal capacitor; and wherein the first sub-pixel area comprises a second transistor, a third transistor, a second liquid crystal capacitor, and a second storage capacitor; wherein a gate of the second transistor and a gate of the third transistor are electrically connected to the transverse signal line, a source of the second transistor and a source of the third transistor are electrically connected to the first secondary-line, a drain of the second transistor is electrically connected to the second liquid crystal capacitor, and a drain of the third transistor is electrically connected to a common electrode.

* * * * *